United States Patent
Posner et al.

(10) Patent No.: US 9,083,350 B1
(45) Date of Patent: Jul. 14, 2015

(54) METHOD AND APPARATUS FOR A DIGITAL NON-LINEAR LOOP CONTROL CIRCUIT

(71) Applicant: AETHERCOMM, INC, Carlsbad, CA (US)

(72) Inventors: Richard Daniel Posner, Tarzana, CA (US); William Brian Camp, Carlsbad, CA (US); Walter Richard DeMore, Poway, CA (US); Michael Scott Weeks, San Diego, CA (US)

(73) Assignee: Aethercomm, Inc., Carlsbad, CA (US)

( * ) Notice: Subject to any disclaimer, the term of this patent is extended or adjusted under 35 U.S.C. 154(b) by 0 days.

(21) Appl. No.: 14/179,454

(22) Filed: Feb. 12, 2014

Related U.S. Application Data

(60) Provisional application No. 61/763,700, filed on Feb. 12, 2013, provisional application No. 61/763,721, filed on Feb. 12, 2013, provisional application No. 61/766,555, filed on Feb. 19, 2013.

(51) Int. Cl.
  *H03L 7/00* (2006.01)
  *H03L 5/00* (2006.01)

(52) U.S. Cl.
  CPC ... *H03L 5/00* (2013.01); *H03L 7/00* (2013.01)

(58) Field of Classification Search
  USPC .................................................. 327/147–159
  See application file for complete search history.

(56) References Cited

U.S. PATENT DOCUMENTS

| | | | | |
|---|---|---|---|---|
| 3,900,823 | A * | 8/1975 | Sokal et al. | 330/149 |
| 5,179,353 | A * | 1/1993 | Miyake | 330/129 |
| 5,539,346 | A * | 7/1996 | Goto | 327/156 |
| 5,886,575 | A * | 3/1999 | Long | 330/129 |
| 6,826,247 | B1 * | 11/2004 | Elliott et al. | 375/376 |
| 2002/0110211 | A1* | 8/2002 | Bockelman | 375/371 |
| 2010/0237915 | A1* | 9/2010 | Mobin et al. | 327/149 |
| 2011/0267120 | A1* | 11/2011 | Ravi et al. | 327/159 |

* cited by examiner

*Primary Examiner* — Ryan Jager
(74) *Attorney, Agent, or Firm* — Novak Druce Connolly Bove + Quigg LLP

(57) ABSTRACT

Described herein are methods and system for providing digital non-linear loop control. In one embodiment, system with digital non-linear loop control comprises a parameter control circuit configured to modify a signal based on a control signal, a processing circuit configured to process the signal, and a parameter measurement circuit configured to measure a parameter value of the signal. The system also comprises a digital non-linear control circuit configured to compare the measured parameter value with a desired parameter value, to determine a control signal value based on the comparison using a lookup table (LUT) that characterizes a non-linear control response of the system, and to output the control signal to the parameter control circuit based on the determined control signal value.

20 Claims, 12 Drawing Sheets

US 9,083,350 B1

METHOD AND APPARATUS FOR A DIGITAL NON-LINEAR LOOP CONTROL CIRCUIT

CROSS-REFERENCE TO RELATED APPLICATIONS

This application claims priority pursuant to 35 U.S.C. §119 (e) to U.S. provisional application Ser. No. 61/763,700, filed Feb. 12, 2013, U.S. provisional application Ser. No. 61/763,721, filed Feb. 12, 2013, and U.S. provisional application Ser. No. 61/766,555, filed Feb. 19, 2013, which applications are specifically incorporated herein, in their entirety, by reference.

BACKGROUND

1. Field

The present disclosure relates to digital non-linear loop control circuits.

2. Background

FIG. 1 is a block diagram illustrating a system 100 with an analog feedback control circuit. The system 100 includes a parameter control circuit 110, a system processing circuit 120, and a parameter measurement circuit 130. The analog feedback control circuit comprises a resistor R, a capacitor C, and an operational amplifier 152.

The analog feedback control circuit is typically used to achieve a desired parameter value at the output. For example, the analog feedback control circuit may be used to achieve a desired output power. In this example, the parameter control circuit 110 may comprise a variable attenuator, and the system processing circuit 120 may comprise a power amplifier (PA). The variable attenuator is configured to attenuate the input signal by an amount that is controlled by a control signal from the feedback control circuit. In operation, the feedback control circuit measures the output power using the parameter measurement circuit 130, and adjusts the control signal to the attenuator in a direction reduces the difference between the desired output power and the measured output power. For example, if the measured output power is below the desired output power, then the feedback control circuit reduces the attenuation by the variable attenuator to raise the output power closer to the desired output power.

The characteristics and behavior of the analog feedback control circuit are governed by a set of equations that are well known in the art. One design constraint for the analog feedback control circuit is that the loop gain must be less than one for response frequencies for which the phase shift is greater than 180°. The well-known Bode plot is one graphical method of showing this constraint. In a linear system, it is well known that it takes approximately three time constants for the system 100 to settle to a value close to the final output value. Further, the time constant is typically about 10 times the inherent delay in the feedback circuitry.

The operation of the analog feedback loop may be been transferred to digital circuitry operating with the same basic approach of integrating the feedback in order to develop the control signal. However, this digital implementation has the same performance limitations as the analog version.

SUMMARY

The following presents a simplified summary of one or more embodiments in order to provide a basic understanding of such embodiments. This summary is not an extensive overview of all contemplated embodiments, and is intended, to neither identify key or critical elements of all embodiments nor delineate the scope of any or all embodiments. Its sole purpose is to present some concepts of one or more embodiments in a simplified form as a prelude to the more detailed description that is presented later.

In one aspect, a system with digital non-linear loop control is described herein. The system comprises a parameter control circuit configured to modify a signal based on a control signal, a processing circuit configured to process the signal, and a parameter measurement circuit configured to measure a parameter value of the signal. The system also comprises a digital non-linear control circuit configured to compare the measured parameter value with a desired parameter value, to determine a control signal value based on the comparison using a lookup table (LUT) that characterizes a non-linear control response of the system, and to output the control signal to the parameter control circuit based on the determined control signal value.

A second aspect relates to a method for digital non-linear loop control. The method comprises measuring a parameter value of a signal in a system, determining a difference between the measured parameter value and a desired parameter value, determining a value for a control signal based on the difference using a lookup table (LUT) that characterizes a non-linear control response of the system, and outputting the control signal to a parameter control circuit in the system based on the determined value for the control signal, wherein the parameter control circuit modifies the signal based on the control signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

Various aspects are now described with reference to the drawings. In the following description, for purposes of explanation, numerous specific details are set forth in order to provide a thorough understanding of one or more aspects. It may be evident, however, that the various aspects may be practiced without these specific details. In other instances, well-known structures and devices are shown in block diagram form in order to facilitate describing these aspects.

Described herein are methods and apparatus for digital non-linear loop control. In one embodiment, a digital non-linear control circuit takes an output of a power detector monitoring forward power from a non-linear radio frequency (RF) power amplifier. In this embodiment, the digital control circuit implements a feedback algorithm that can use either an equation or a look up table (LUT) that compensates for a non-linear combined response of the gain control and power amplifier operating close to saturation. As a result, the digital control circuit is able to settle to a final value in a time that is much faster than a standard analog control loop, and does so in a stable manner that takes into account delays in the combined control circuit and power amplifier.

The digital non-linear control loop may also be used to provide feedback control of other parameters for other systems. Other examples may include controlling a phase shift versus frequency, phase shift versus frequency and power or phase shift versus frequency, power, and temperature for a power amplifier. The digital non-linear control loop may be effective for non-linear systems where the use of an analog feedback circuit would result in the loop parameters being adjusted to compensate for the highest loop gain and slowest feedback response. The digital non-linear control loop may adapt its feedback to compensate for the variation in loop gain and response time.

Figure 2:
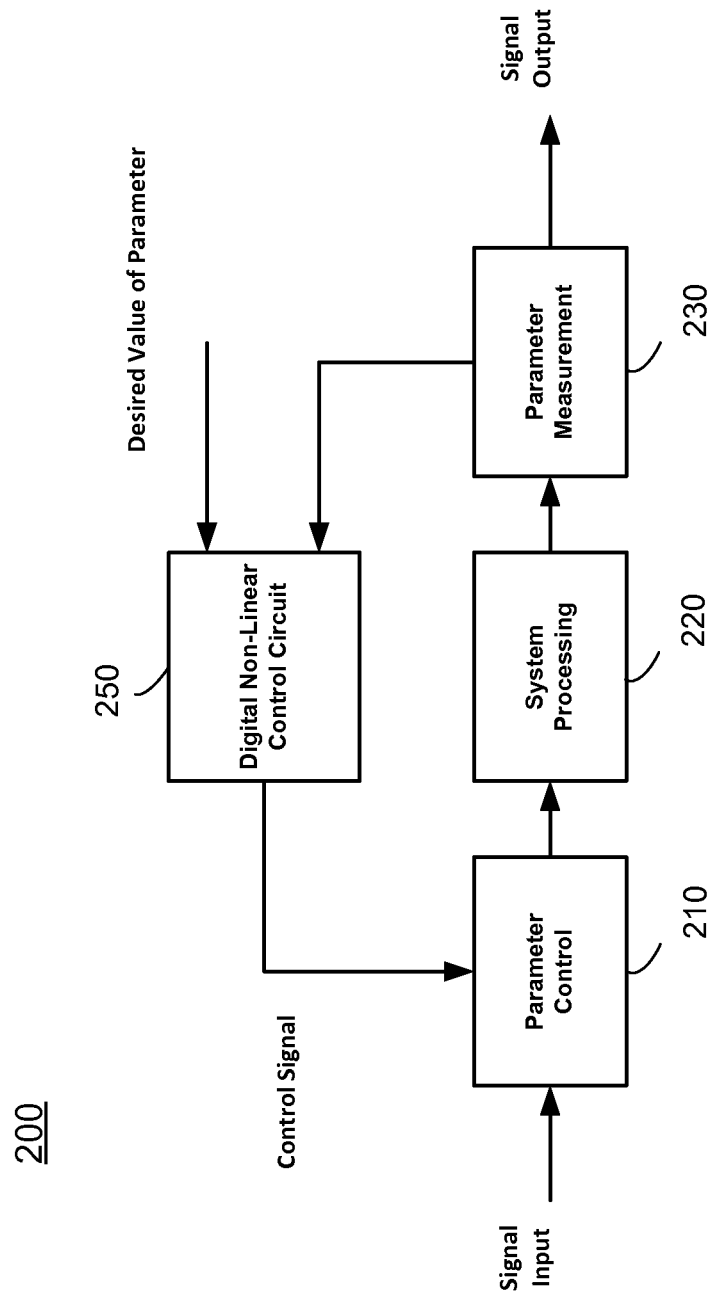
FIG. 2 is a block diagram illustrating a digital non-linear control circuit according to an embodiment of the present disclosure.

FIG. 2 is a block diagram illustrating a system 200 with a digital non-linear control loop according to an embodiment of the present disclosure. The system comprises a parameter control circuit 210, a system processing circuit 220, a parameter measurement circuit 230, and a digital non-linear control circuit 250. The parameter control circuit 210 is configured to vary a controlled parameter (e.g., phase, amplitude, etc.) of a signal based on control signal from the digital non-linear control circuit 250. For example, the parameter control circuit 210 may comprise a variable phase shifter, a variable attenuator, or other circuit that can vary a controlled parameter. In one embodiment, the relationship between the parameter and the control signal is non-linear. The signal passes through a system processing circuit 220 (e.g., power amplifier) which is, to some extent, non-linear but assumed to be monotonic.

The parameter measurement circuit 230 measures the parameter at the output. The digital non-linear control circuit 250 compares the value of the measured parameter with a desired value of the parameter, and through a non-linear process, adjusts the control signal that drives the parameter control circuit 210 based on the comparison. In one embodiment, the non-linear process involves using an equation or a lookup table (LUT) that models the non-linear control response of the system, as discussed further below.

Figure 3:
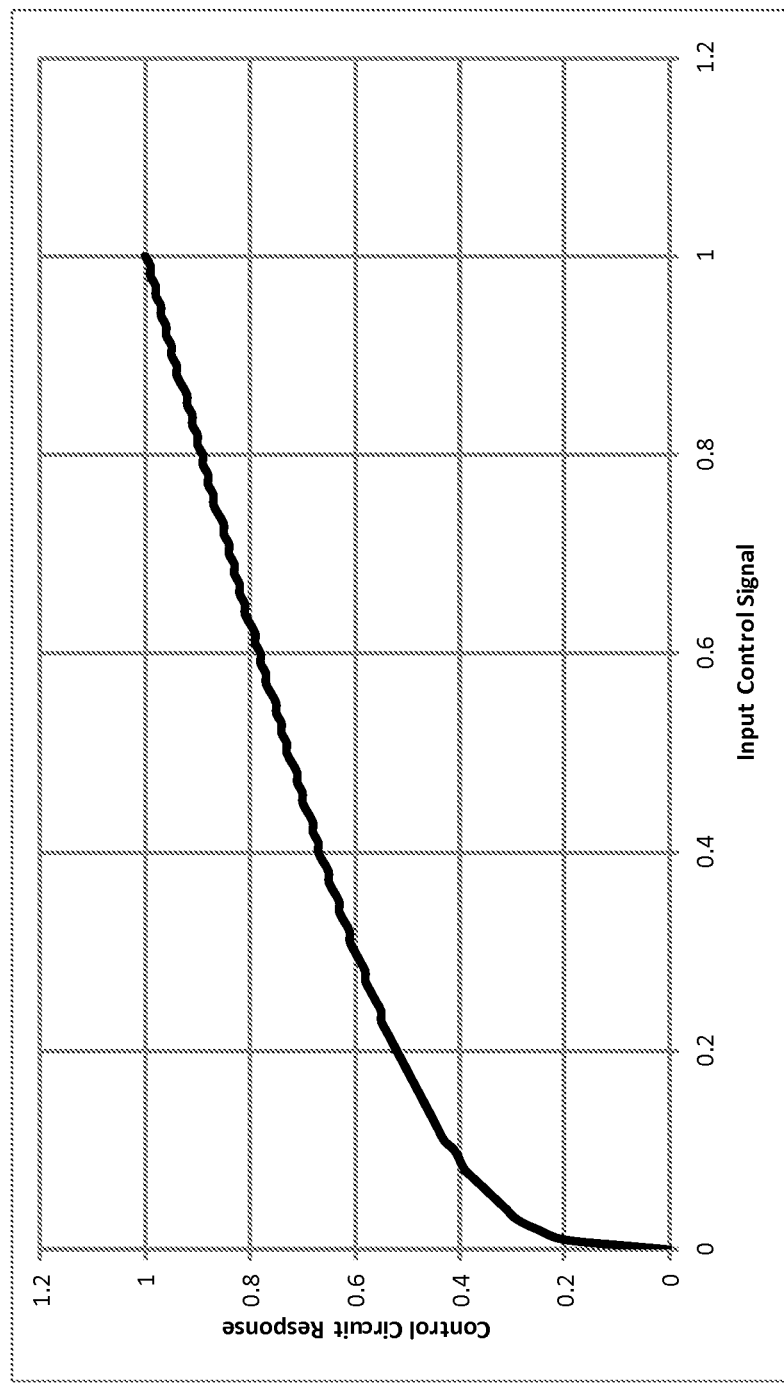
FIG. 3 is a plot showing an example of a non-linear control response curve according to an embodiment of the present disclosure.

FIG. 3 is a plot showing an example of a non-linear control response curve according to an embodiment of the present disclosure. The horizontal axis shows the input control signal to the parameter control circuit 210, and the vertical axis shows the response of the parameter control circuit 210 or the combined response of the parameter control circuit 210 and the system processing circuit 220 to the control signal. As shown in FIG. 3, the control response curve is non-linear, in which the slope of the control response curve is steep at low values of the control signal and flattens out at higher values of the control signal.

The control response curve for a particular system may be determined by running tests on the system. For example, the control response curve may be determined by varying the value of the control signal to the parameter control circuit 210 in an open loop (i.e., without feedback), and measuring the control response at the parameter control circuit 210 or the system processing circuit 220 as the value of the control signal is varied.

Once the control response curve is measured, an equation or a LUT modeling the non-linear control response may be generated based on the measured control response curve. For example, the LUT may be generated with different control signal values mapped to the corresponding measured control response values. In another example, the equation may be generated by fitting an equation to the measured control response curve.

Figure 4:
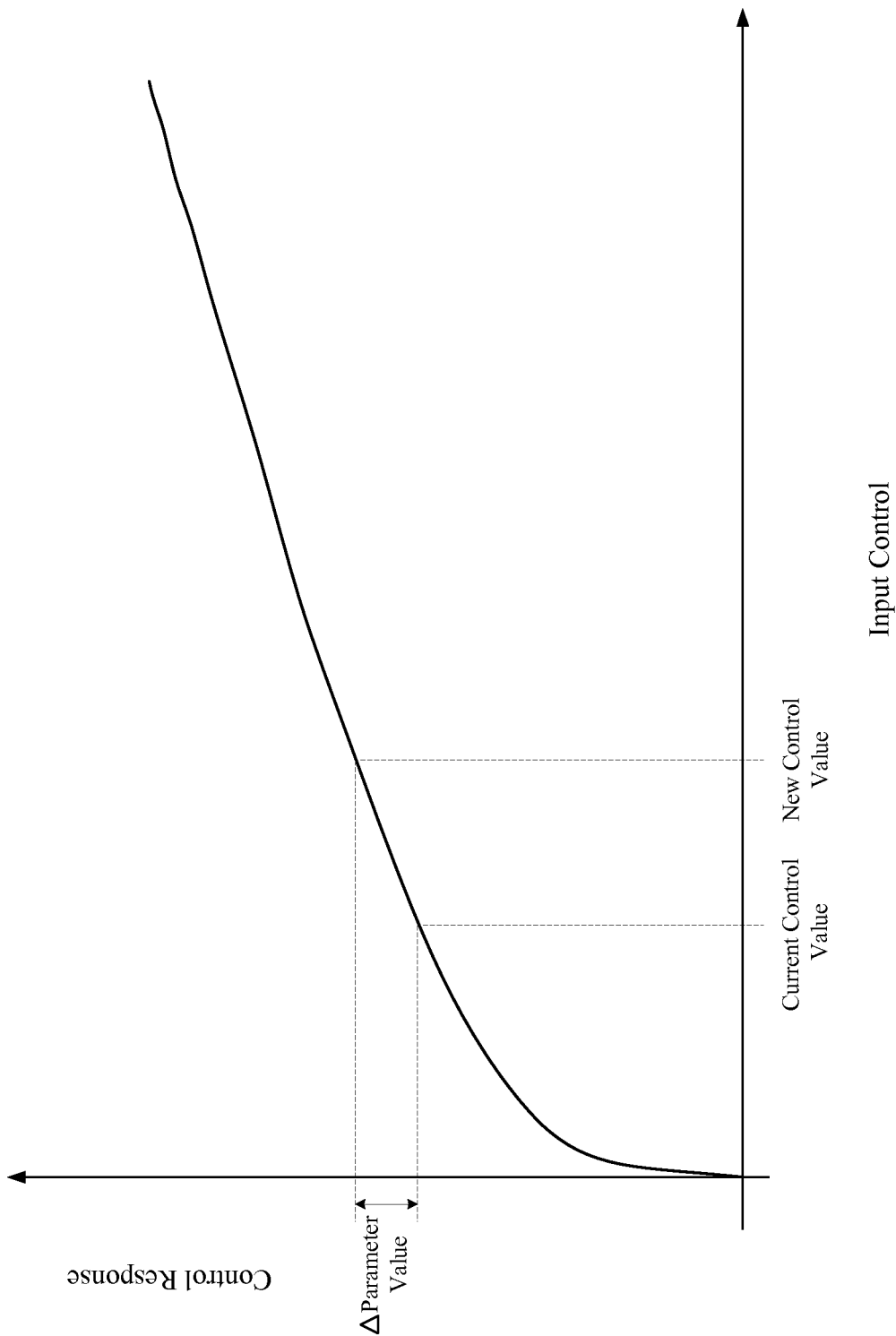
FIG. 4 is a plot illustrating digital non-linear feedback based on a non-linear control response curve according to an embodiment of the present disclosure.

Once the equation or the LUT is generated based on the non-linear control response curve, the digital non-linear control circuit 250 can use the equation or the LUT to adjust the control signal in a non-linear feedback loop as follows. The digital non-linear control circuit 250 receives the desired parameter value and the measured parameter value from the parameter measurement circuit 230. The digital non-linear control circuit 250 then determines the difference between the measured parameter value and the desired parameter value. Using the equation or the LUT, the digital control circuit 250 determines how much the control signal needs to be changed from its current value in order to change the value of the parameter by the difference. An example of this process is illustrated in FIG. 4, which shows an exemplary non-linear response curve modeled by the equation or the LUT. FIG. 4 shows the current value of the control signal on the input control axis, and the difference between the desired parameter value and the measured parameter value ($\Delta$ parameter value in FIG. 4) on the control response axis. In this example, starting from the current value of the control signal, the digital control circuit 250 determines a new value of the control signal that is predicted by the non-linear response curve to change the value of the measured parameter by the difference ($\Delta$ parameter value in FIG. 4).

The digital non-linear control circuit 250 may repeat the above process in an iterative fashion until the difference between the desired parameter value and the measured parameter falls within allowable bounds. To ensure stability of the feedback loop, the digital control circuit 250 may wait for a predetermined amount of between changing the value of the control signal and measuring the value of the parameter at the output for the next iteration. The amount of time may be based on a time delay expected through the system.

Figure 5:
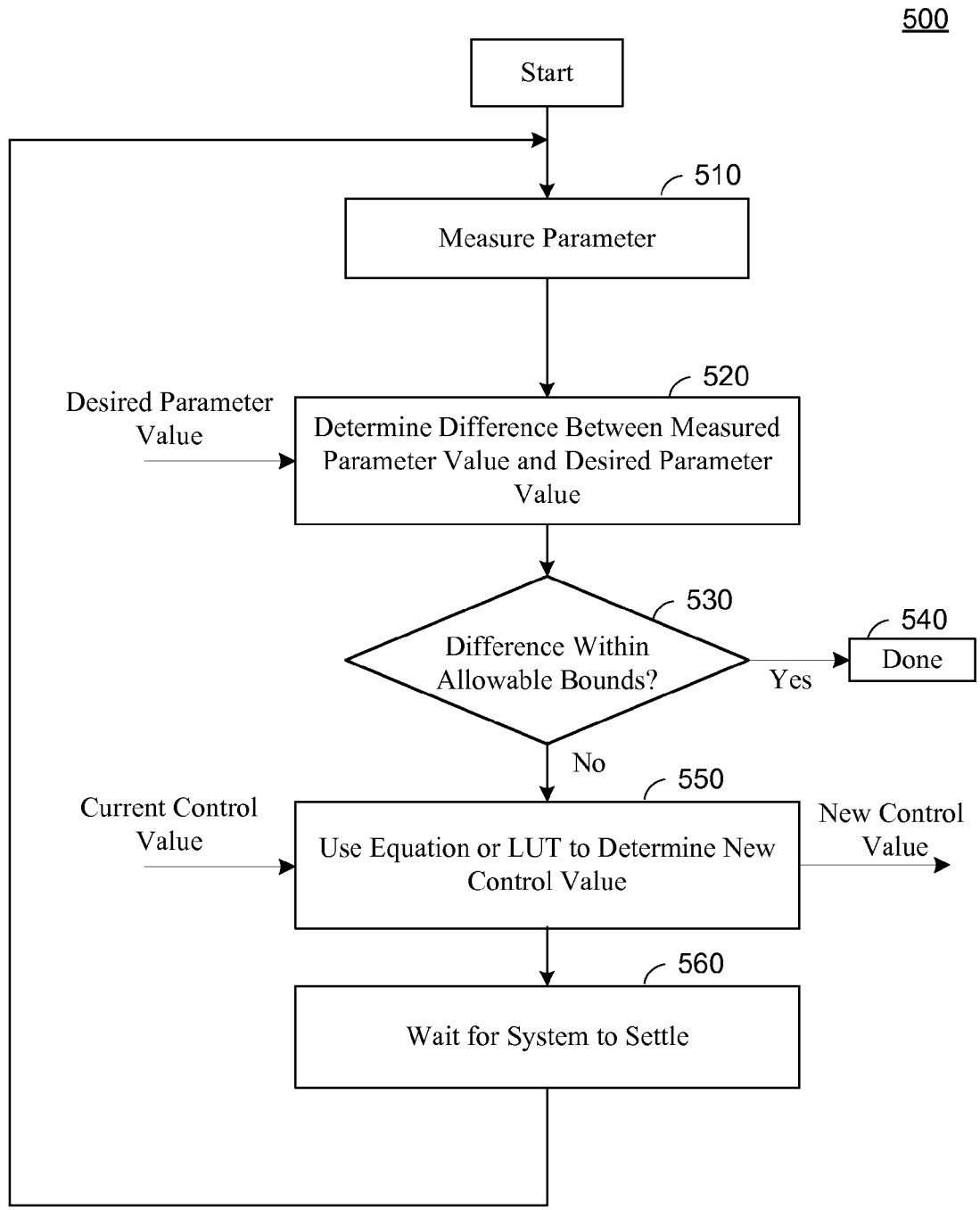
FIG. 5 is a flow diagram illustrating a method of digital non-linear loop control according to an embodiment of the present disclosure.

FIG. 5 is a flow chart illustrating an exemplary method 500 for a digital non-linear loop control according to an embodiment of the present disclosure. The method 500 may be performed by the digital non-linear control circuit 250.

At step 510, the parameter that is being controlled (e.g., a phase or amplitude value) is measured. For example, the parameter may be measured at the output of the system by the parameter measurement circuit 230.

At step 520, the difference between the measured parameter value and the desired parameter value is determined. At step 530, a determination is made whether the difference is within allowable bounds. If the difference is within the allowable bounds, then the method 500 is done at step 540. Otherwise the method 500 continues to step 550.

At step 550, a new value for the control signal is determined using an equation or LUT based on the current value of the control signal and the difference between the measured parameter value and the desired parameter value. For example, the equation or LUT may model a non-linear response curve of the system. Starting from the current value of the control signal, the equation or LUT is used to determine a new value for the control signal that is predicted by the non-linear response curve to change the value of the measured parameter by the difference. To prevent the measured parameter from potential overshooting the desired parameter value in the next iteration, the new value for the control signal may be determined based on a percentage of the difference (e.g., 90% of the difference). The new value of the control signal is output to the parameter control circuit 210.

At step 560, the method 500 waits for a predetermined amount of time for the system to settle. For example, the amount of time may be based on a time delay expected through the system. After the wait, the method 500 loops back to step 510 for the next iteration. The wait helps ensure stability of the digital control loop.

Figure 1:
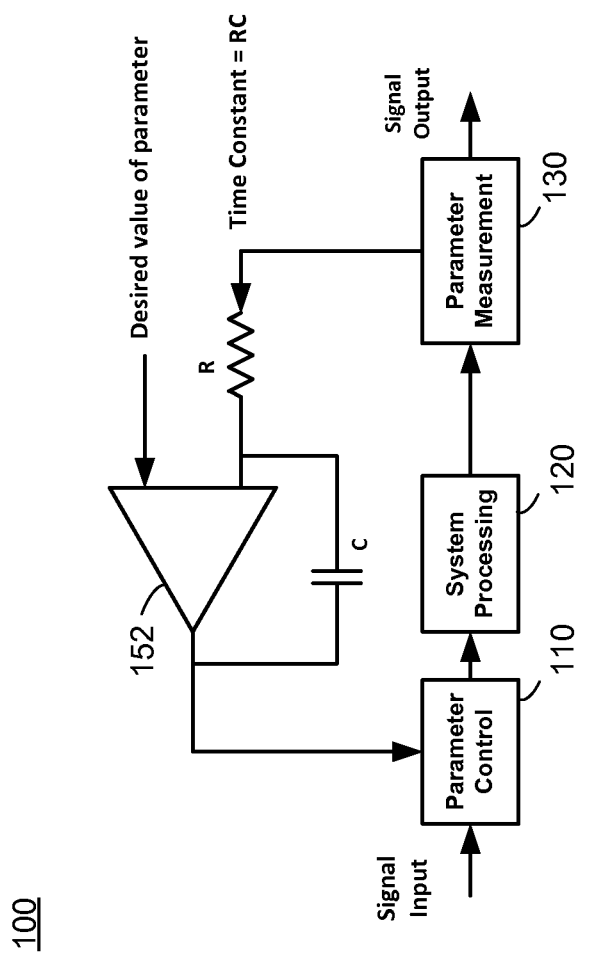
FIG. 1 is a block diagram illustrating a system with an analog feedback control circuit.
Figure 6:
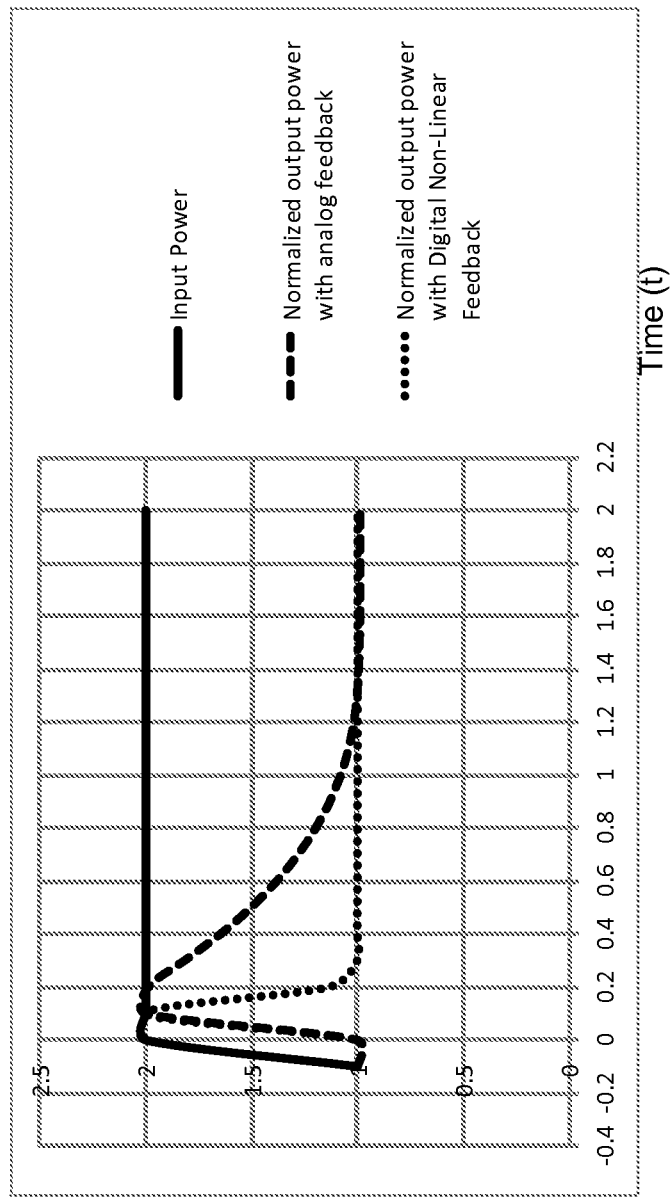
FIG. 6 is a graph showing a response comparison between an analog control circuit and a digital non-linear control loop according to an embodiment of the present disclosure.

FIG. 6 shows a comparison of the response of a typical analog circuit (e.g., analog feedback control circuit in FIG. 1) with the response of a digital non-linear control circuit (e.g., digital non-linear control circuit 250) according to an embodiment of the present disclosure. In this example, the parameter control circuit 210 is a variable attenuator, and the system processing circuit 220 is a power amplifier. FIG. 6 assumes the non-linear response curve shown in FIG. 3.

In this example, the power amplifier outputs a normalized value of power equal to 1 based on a normalized input value of 1. The input is suddenly stepped up to a value of 2 and the control circuit controls the variable attenuator to bring the output of the power amplifier back to a value of 1. The solid line illustrates the input power as a function of time. The input power starts at 1 at time −0.1, rises quickly to 2 and stays at 2.

In this example, the delay may be 0.1 microsecond in the attenuator and the power amplifier. As shown in FIG. 6, there is a 0.1 microsecond delay before the output responds to the step up of the input power. In this example, the analog feedback control circuit takes approximately 1.3 microseconds to settle to a final value. In contrast, the digital non-linear control circuit responds in less than 0.4 microseconds.

In one embodiment, when the system is first powered up or waiting for a signal to process (e.g., standby), the digital non-linear control circuit 250 may monitor the input of the system to determine whether a signal is present (e.g., using a signal detector). If a signal is present, then the digital control circuit 250 may determine whether to operate in an open-loop mode or closed-loop mode. For example, a decision to operate in the open-loop mode may be made if the input power is very low (e.g., below a threshold).

In the closed-loop mode, the digital control circuit 250 provides digital non-linear feedback control, as discussed above. In the open-loop mode, the control circuit 250 may allow an external control signal to control the parameter control circuit 210. When the system operates in the closed-loop mode, the control circuit 250 may initially use a default control signal value. Alternatively, the control circuit 250 may initially use the last value of the control signal from the last time the signal was present.

If an input signal is not present, the digital control circuit 250 may suppress processing and hold the last value of the control signal until the input signal is present once again.

Exemplary applications of the digital non-linear control loop will now be described according to various embodiments of the present disclosure.

Figure 7:
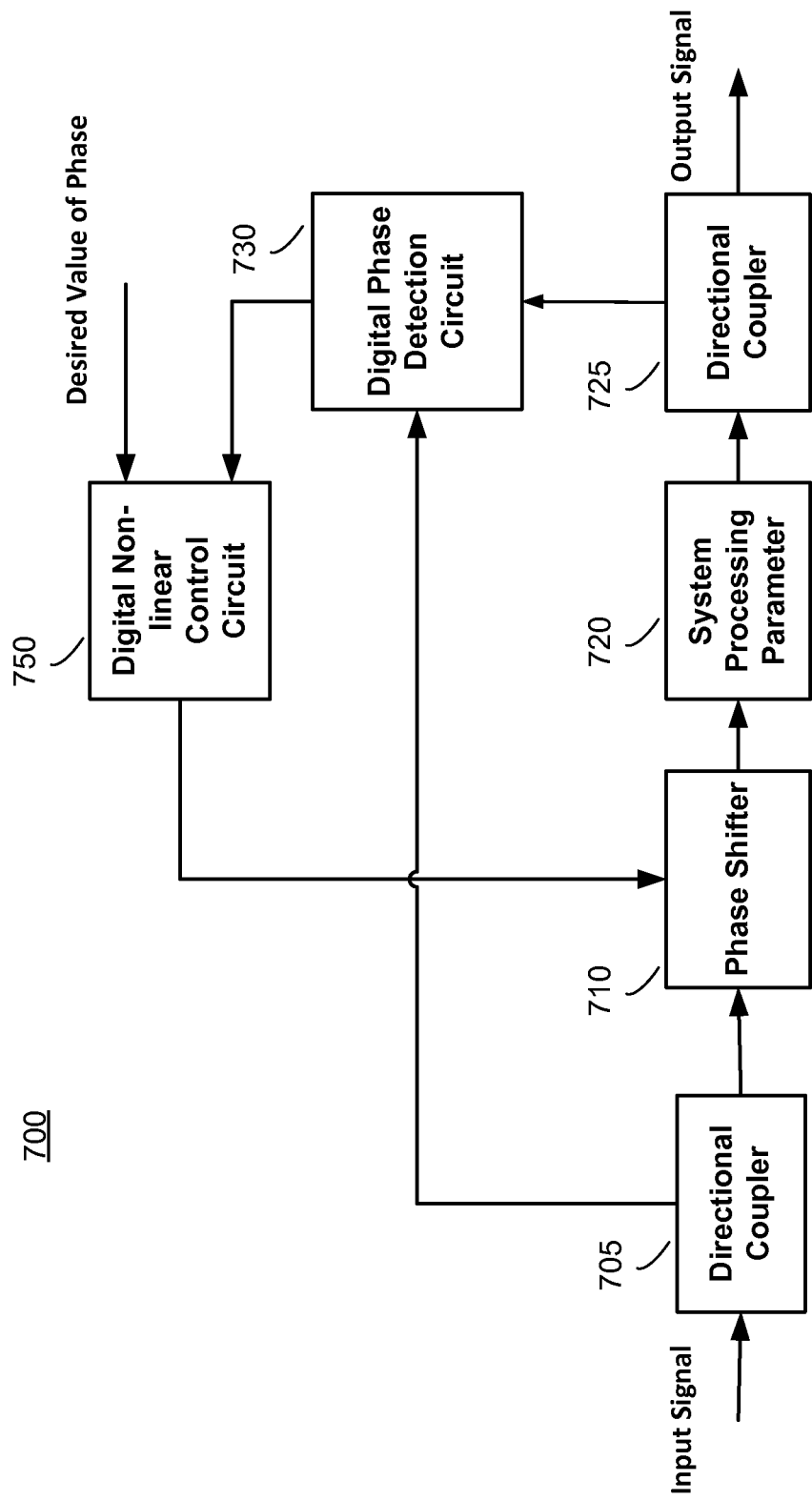
FIG. 7 is a block diagram illustrating a digital phase control circuit according to an embodiment of the present disclosure.

FIG. 7 is a block diagram illustrating a system 700 with a digital phase control loop according to an embodiment of the present disclosure. The system 700 comprises an input directional coupler 705, a variable phase shifter 710, a system processing circuit 720, an output directional coupler 725, a digital phase detection circuit 730, and a digital non-linear control circuit 750. In this embodiment, the digital phase control loop is configured to maintain a desired phase shift of the output relative to the input of the system.

In operation, the input directional coupler 705 couples an input signal sample to the digital phase detection circuit 730. The variable phase shifter 710 shifts the phase of the input signal by an amount controlled by a control signal (e.g., control voltage) from the digital non-linear control circuit 750. The system processing circuit 720 processes the signal from the phase shifter 710. For example, the system processing circuit 720 may comprise a power amplifier, which may add a phase shift to the signal. The output coupler 725 couples an output signal sample to the digital phase detection circuit 730.

The digital phase detection circuit 730 digitally calculates the phase difference between the output signal and the input signal (the phase shift of the output relative to the input). The digital phase detection circuit 730 outputs the measured phase shift to the digital control circuit 750. The digital non-linear control circuit 750 determines the difference between a desired phase shift and the measured phase shift, and generates a control signal to drive the phase shifter 710 in a direction that reduces the difference.

Figure 8:
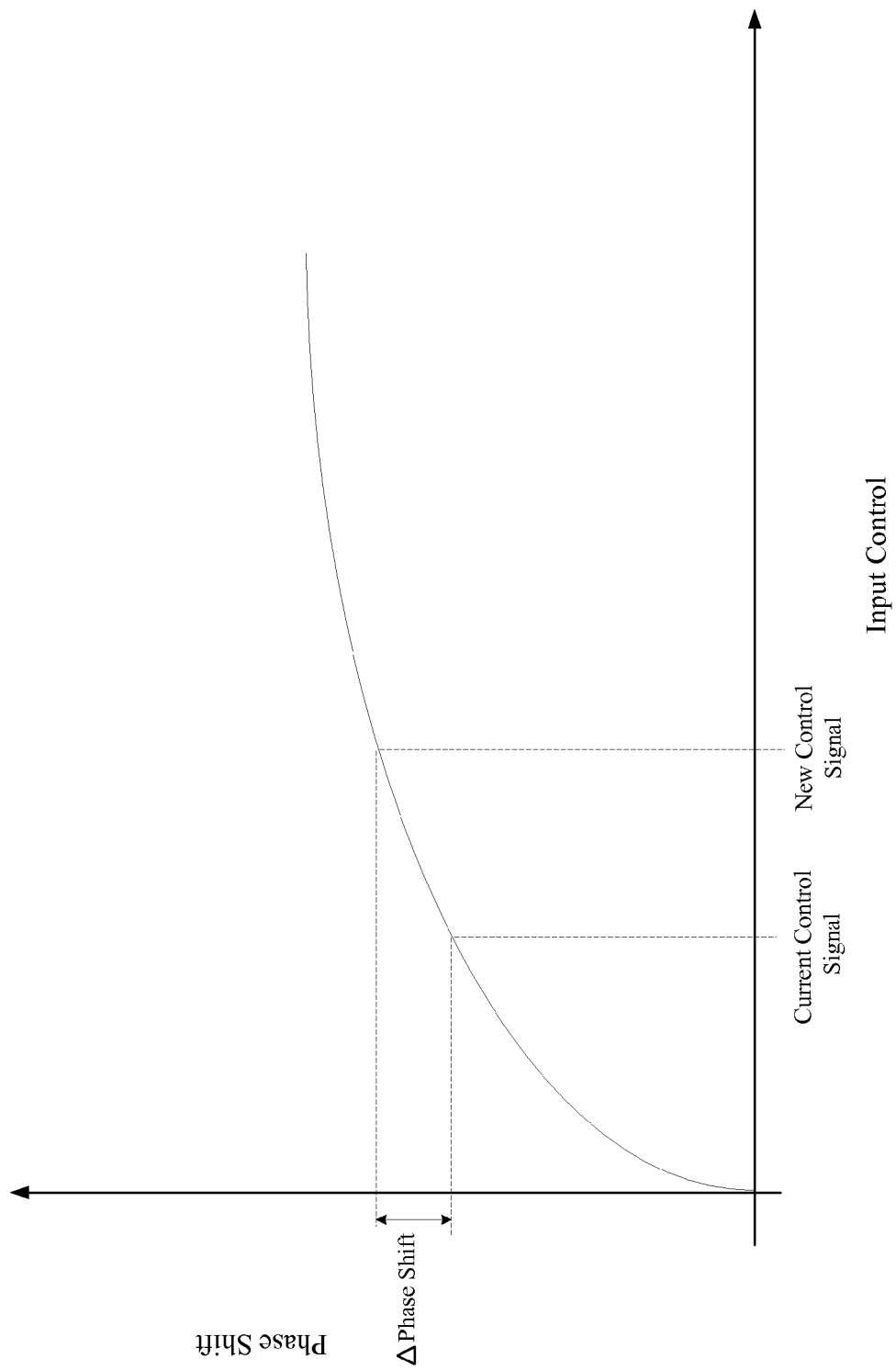
FIG. 8 is a plot illustrating digital feedback based on a non-linear control response curve of a phase shifter according to an embodiment of the present disclosure.

In one embodiment, the digital control circuit 750 determines the control signal to the phase shifter 710 using an equation or a lookup table (LUT) that models the non-linear control response of the phase shifter 710. In this embodiment, the phase shift added by the system processing circuit (e.g., power amplifier) is assumed to be quasi static (e.g., slow moving). Based on this assumption, it can be assumed that a change in the phase shift of the system in response to a change in the control signal can be characterized by the non-linear control response of the phase shifter 710. The non-linear control response curve of the phase shifter 710 can be determined, for example, by varying the control signal to the phase shifter 710 in an open loop, and measuring the phase shift of the phase shifter 710 as the control signal is varied. In this regard, FIG. 8 shows an exemplary non-linear control response for the phase shifter 710.

Once the control response curve of the phase shifter 710 is measured, an equation or a LUT modeling the non-linear control response of the phase shifter 710 may be generated based on the measured control response curve. The digital control circuit 750 may then use the equation or the LUT to adjust the control signal in a non-linear feedback loop as follows. The digital non-linear control circuit 750 receives the desired phase shift and the measured phase shift from the digital phase detection circuit 730. The digital non-linear control circuit 750 then determines the difference between the desired phase shift and the measured phase shift. Using the equation or the LUT, the digital control circuit 750 determines how much the control signal needs to be changed from its current value in order to change the phase shift of the phase shifter 710 by the difference. An example of this process is illustrated in FIG. 8, which shows an exemplary non-linear response curve for the phase shifter 710. FIG. 8 shows the current value of the control signal, and the difference between the desired phase shift and the measured shift (Δ phase shift in FIG. 8). In this example, starting from the current value of the control signal, the digital control circuit 750 determines a new value of the control signal that is predicted by the non-linear response curve to change the value of the measured phase shift by the difference (Δ phase shift in FIG. 8).

The digital non-linear control circuit 750 may repeat the above process in an iterative fashion until the difference between the desired phase shift and the measured phase shift falls within allowable bounds.

Figure 9:
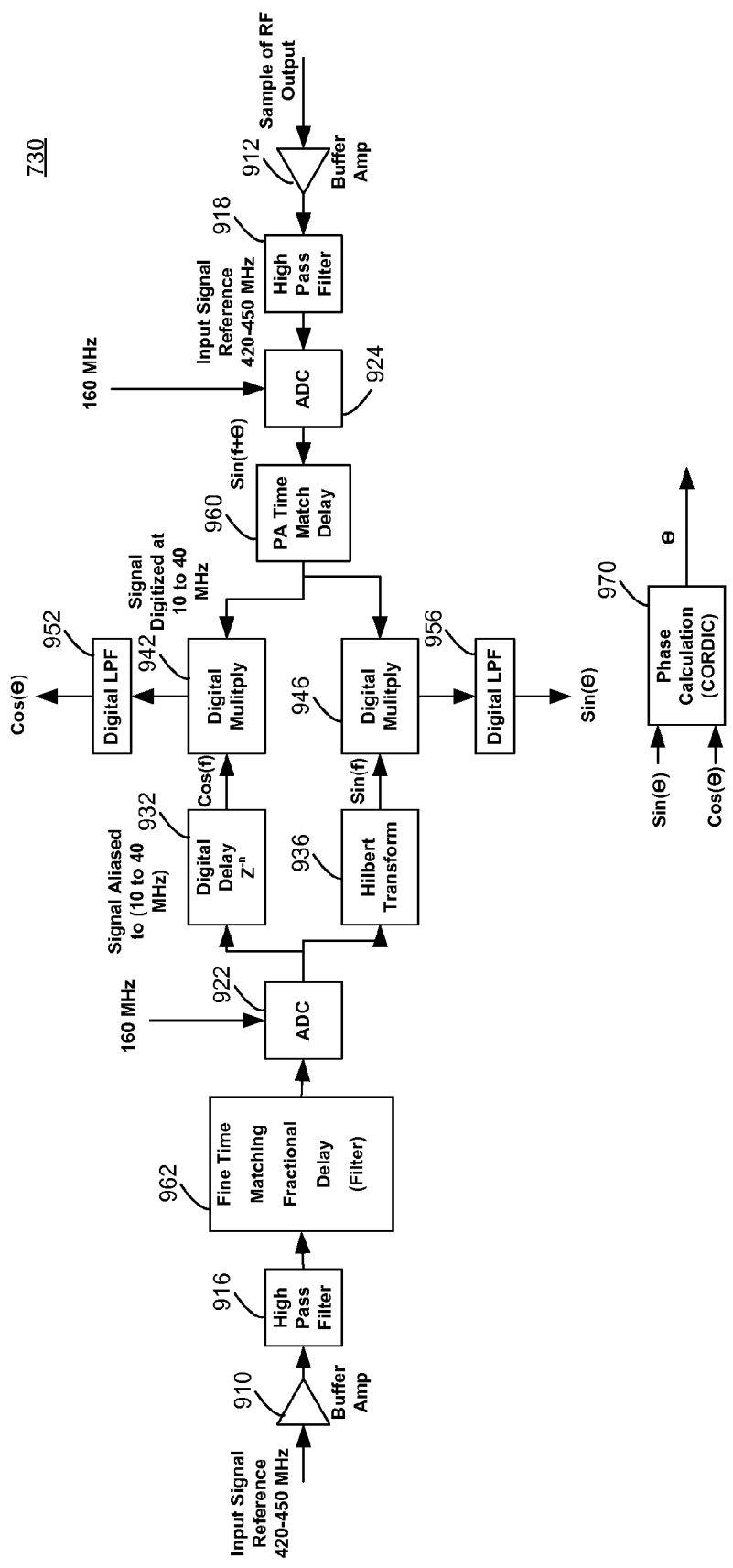
FIG. 9 shows an exemplary implementation of a phase detection circuit according to an embodiment of the present disclosure.

FIG. 9 is a block diagram showing an example implementation of the digital phase detection circuit 730. As shown in FIG. 9, the digital phase detection circuit 730 receives a sample of the input signal from the input direction coupler 705 and a sample of the output signal from the output directional coupler 725. The input and output signals may be RF signals with a frequency range of 420-450 MHz. The input and output signals may be amplified by optional buffer amplifiers 910 and 912, respectively, and high-passed filtered by optional high-pass filters 916 and 918, respectively.

As shown, ADC 922 digitizes the input signal at a rate 160 MHz) which, at either the fundamental or harmonic, is somewhat lower than the signal frequency. This subsampling approach results in digitization of the signal at some IF frequency that can easily be handled by a field programmable gate array (FPGA). Similarly, ADC 924 digitizes the output signal at a subsampling rate (e.g., 160 MHz).

The digitized input signal is split between a digital delay 932 and a Hilbert transform circuit 936. The Hilbert transform circuit 936 phase shifts the digitized input signal by 90 degrees such that a cosine and a sine of the digitized input signal are generated, as shown in FIG. 9. The digital delay 932 may delay the digitized input signal by an amount approximately matching the delay of the Hilbert transform to ensure that the cosine and sine of the digitized input signal have approximately the same delay.

Digital multiplier 942 multiplies the cosine of the digitized input signal with the digitized output signal. The output of the multiplier 942 is averaged by low pass filter (LPF) 952 to produce cos(Θ), where Θ is the phase shift of the output relative to the input. Similarly, digital multiplier 946 multiplies the sine of the digitized input signal with the digitized output signal. The output of the multiplier 946 is averaged by low pass filter (LPF) 956 to produce sin/(Θ). As shown in FIG. 9, the digital phase detection circuit 730 may include a PA time matched delay 960 and fine time matched delay 962 to compensate for delay through the system.

As shown, cos(Θ) and sin(Θ) are fed into a circuit 970 that calculates the phase shift from the ratio of sin(Θ) and cos(Θ) (e.g., finds the arctangent of the ratio) by use of a vector mode coordinate rotation digital computer (CORDIC) algorithm. Essentially, the digital phase detection circuit 730 may be a digital implementation of a quadrature down converter. By implementing the process digitally, the phase may be directly calculated. Further, performing the process digitally may avoid errors of analog implementation such as quadrature offset errors.

Figure 10:
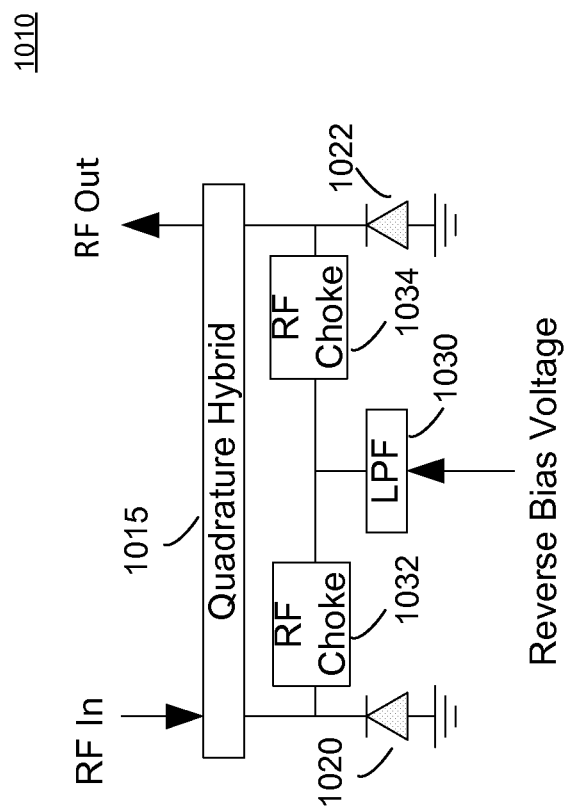
FIG. 10 shows an exemplary implementation of a phase shifter according to an embodiment of the present disclosure.

The variable phase shifter 710 may be implemented with a voltage-controlled analog phase shifter. In this example, the digital non-linear control circuit may include a digital-to-analog converter DAC to convert a digital control signal into a control voltage to drive the variable phase shifter. FIG. 10 shows an exemplary implementation of a voltage-controlled analog phase shifter 1010, which is designed to achieve about a ±20° phase variation. In this implementation, the input signal is input to an RF input port of a quadrature hybrid coupler 1015, reflected off of identical reverse biased varactor diodes 1020 and 1022, and output from to the RF output port of the quadrature hybrid coupler 1015. Each of the identical varactors acts as a variable capacitor thereby reflecting the signal with almost no amplitude variation and only a phase variation. The phase variation is controlled by a reverse-bias voltage (control voltage) applied to the varactors through a low-pass filter 1030 and RF chokes 1032 and 1034. Since the design utilizes COTS quadrature hybrid and diodes, many different parts can be substituted to achieve very similar performance especially given that the feedback loop that drives the phase shifter 1010 will automatically set the voltage for the correct phase shift.

In another example, the variable phase shifter 710 may be implemented with a digital phase shifter that can be directly driven by a digital control signal. In yet another example, the variable phase shifter 710 may be implementation using a combination of an analog phase shifter and a digital phase shifter in series.

The system 700 may be used in applications where phase tracking is essential. One example is phased array antennas, where each antenna may be driven by a separate power amplifier. In this application, it is desirable for the phase shifts by the different power amplifiers to be the same in order to maintain the relative phases between the signals to the different antennas, which is essential for proper beam forming beam. In this example, the system 700 may be used for each power amplifier to compensate for differences in the phase shifts of the amplifiers so that the different signals undergo the same phase shifts (i.e., desired phase shift), thereby maintain the relative phases between the signals for beam forming. The system 700 may also be used in applications that require the phase shift to be approximately constant over temperature and/or other parameter.

Figure 11:
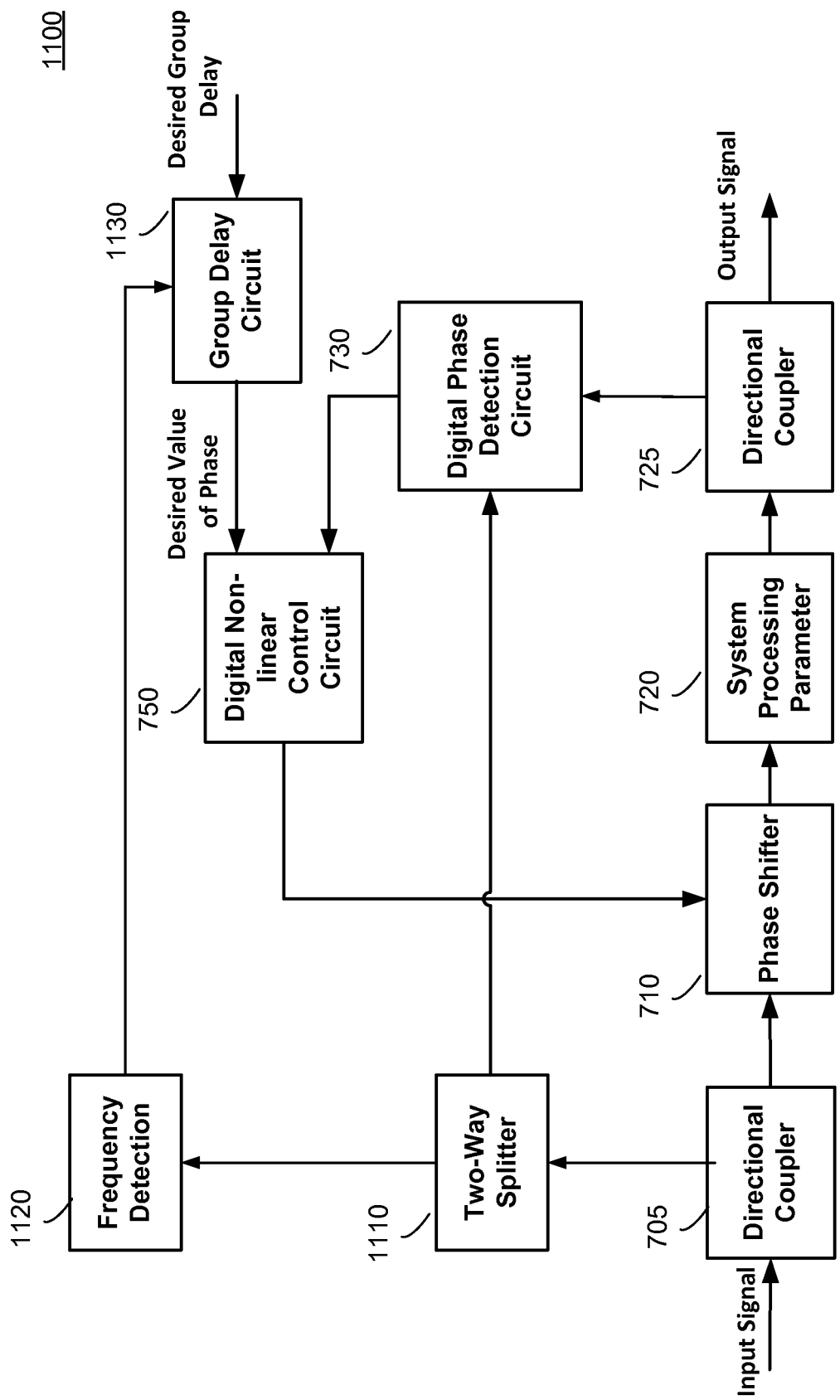
FIG. 11 is a block diagram illustrating a digital group delay control circuit according to an embodiment of the present disclosure.

FIG. 11 is a block diagram illustrating a system 1100 with a digital phase control loop according to an embodiment of the present disclosure. The system 1100 builds on the system 700 in FIG. 7, and may be used to provide a desired group delay, where group delay may be defined by the following equation:

$$\text{Group delay} = \Delta\Theta/\Delta\omega \tag{1}$$

where ΔΘ is a change in phase (in radians) over a change in frequency (radians per second). It can be shown that this equation is the same as:

$$\text{Group delay} = \Delta\Phi/(360*\Delta f) \tag{2}$$

where ΔΦ is the change in phase in degrees and Δf is the change in frequency in Hz.

The system 1100 implements equation (1) or (2) by monitoring the input frequency and using it to vary the phase shift through the system with frequency. By doing so, the group delay through the system can be varied either to be greater or less than nominal group delay. Such a system is ideal where a narrow banded signal is swept through a range of frequencies. An example includes a long range chirp radar consisting of a number of elements that must respond with a constant and known group delay as well as a controlled phase response.

To accomplish this, the system 1100 builds on the system 700 in FIG. 7 by adding a two-way power splitter 1110, a digital frequency detection circuit 1120 and a group delay circuit 1130. In this embodiment, the input coupler 705 outputs the input signal sample to the two-way power splitter 1110. The two-way power splitter 1110 splits the input signal sample between the digital frequency detection circuit 1120 and the digital phase detection circuit 730.

The digital frequency detection circuit 1120 detects the frequency of the input signal, and outputs the detected input frequency to the group delay circuit 1130. The group delay circuit 1130 determines a desired phase shift based on the detected input frequency and a desired group delay. To do this, the group delay circuit 1130 may determine the desired phase shift from the detected input frequency and the desired group delay based on equation (1) or (2). In this example, the change in frequency may be the detected input frequency relative to a reference frequency (e.g., lowest input frequency). In one embodiment, a LUT may be generated by pre-calculating desired phase shifts for different input frequencies according to a desired group delay, and mapping each input frequency to the corresponding phase shift. In this embodiment, the group delay circuit 1030 may determine a desired phased shift from the detected input frequency using the LUT.

The rest of the system 1100 performs similar to the system 700 in FIG. 7. In this regard, the digital phase detection circuit 730 digitally calculates the phase difference between the output signal and the input signal (the phase shift of the output relative to the input). The digital phase detection circuit 730 outputs the measured phase shift to the digital control circuit 750. The digital non-linear control circuit 750 determines the difference between the desired phase shift from the group delay circuit 1130 and the measured phase shift, and generates a control signal to drive the phase shifter 710 in a direction that reduces the difference.

In one embodiment, the desired phase shift from the group delay circuit 1130 may be given by the following equation:

$$\Theta = \Theta_o + 360 * \Delta F * T \quad (3)$$

where:

$\Theta$ is the desired phase shift;

$\Theta_o$ is a phase shift at the lowest frequency;

$\Delta F$ is the detected input frequency relative to the lowest frequency; and T is the desired group delay.

Figure 12:
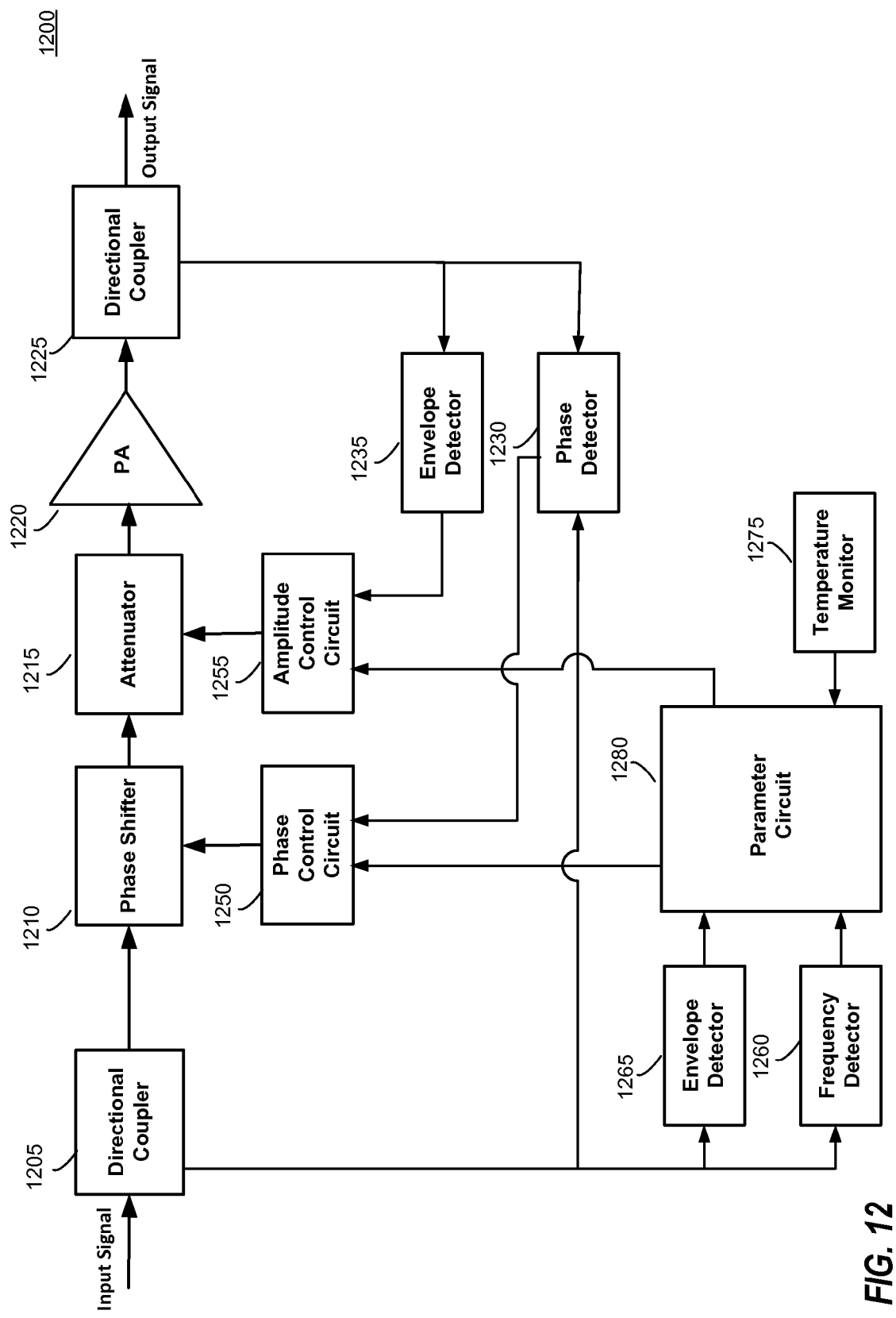
FIG. 12 is a block diagram illustrating a system with digital control loops according to an embodiment of the present disclosure.

FIG. 12 is a block diagram illustrating a system 1200 with digital control loops according to an embodiment of the present disclosure. The system 1200 is capable of providing feedback control for various parameters, as discussed further below.

The system 1200 comprises an input directional coupler 1205, a variable phase shifter 1210, a variable attenuator 1215, a power amplifier (PA) 1220, an output directional coupler 1225, a digital phase detector 1230, a digital phase control circuit 1250, and an amplitude control circuit 1255. The system 1200 further comprises an input frequency detector 1260, an input envelope detector 1265, an output envelope detector 1235, a temperature monitor 1275, and a parameter circuit 1280.

As shown in FIG. 12, the input signal passes through the variable phase shifter 1210 and variable attenuator 1215 before going to the power amplifier 1220. The variable phase shifter 1210 may be implemented with a voltage variable phase shifter (VVA) (e.g., phase shifter 1010), a digital phase shifter or a combination of both. In the example where the phase shifter 1210 is implemented with both a voltage variable phase shifter and a digital phase shifter, the digital phase shifter may be positioned before the attenuator 1215 and the voltage variable phase shifter may be positioned after the attenuator 1215. In this example, the digital phase shifter may be used for coarse phase shift adjustment since a digital phase shifter is typically capable of covering a full 360°, and the voltage variable phase shifter may be used for finer phase shift adjustment ±20° phase variation). The variable attenuator may be implemented with a voltage variable attenuator.

The input directional coupler 1205 outputs an input signal sample to the phase detector 1230, the input envelope detector 1265, and the frequency input detector 1260. This may be done using a power splitter (not shown) that splits the input signal sample from the direction coupler 1205 among the phase detector 1230, the input envelope detector 1265 and the frequency input detector 1260. The input envelope detector 1265 is configured to measure the amplitude of the input signal, and the frequency detector 1260 is configured to measure the frequency of the input signal. The temperature monitor 1275 is configured to measure temperature (e.g., temperature of the system).

The parameter circuit 1280 receives the measured input amplitude from the envelope detector 1265, the measured input frequency from the frequency detector 1260, and the measured temperature from the temperature monitor 1275. This enables the parameter circuit 1280 to generate a desired phase shift as a function of frequency, amplitude, temperature or any combination thereof. Similarly, this enables the parameter circuit 1280 to generate a desired output amplitude as a function of frequency, amplitude, temperature or any combination thereof.

The output directional coupler 1225 outputs an output signal sample to the phase detector 1230, and the output envelope detector 1235. This may be done using a power splitter (not shown) that splits the output signal sample from the direction coupler 1225 among the phase detector 1230, and the output envelope detector 1235. The output envelope detector 1235 is configured to measure the amplitude of the output signal. The phase detector 1230 is configured to measure the phase difference between the output signal and the input signal (the phase shift of the output relative to the input). The path between the input directional coupler 1205 and the phase detector 1230 may include a delay line (not shown) that compensates for the delay in the RF amplifier section.

The phase control circuit 1250 is configured to determine the difference (error) between the measured phase shift from the phase detector 1230 and the desired phase shift from the parameter circuit 1280. The phase control circuit 1250 adjusts the control signal to the phase shifter 1210 based on the difference to move the phase shift closer to the desired phase shift. As discussed above, the phase control circuit 1250 may do this using an equation or LUT that models the non-linear control response of the phase shifter 1210.

The amplitude control circuit 1255 is configured to determine the difference (error) between the measured output amplitude from the envelope detector 1235 and the desired output amplitude from the parameter circuit 1280. The amplitude control circuit 1255 adjusts the control signal to the variable attenuator 1215 based on the difference to move the output amplitude closer to the desired output. The amplitude control circuit 1255 may do this using an equation or LUT that models the non-linear control response of the system. The non-linear control response may be determined, for example, by varying the control signal to the attenuator 1215 in an open loop, and observing the response at the output of the attenuator 1215 or the PA 1220.

Examples of applications of the system 1200 will now be discussed according to embodiments of the present disclosure.

In one example application, it may be desirable for the system 1200 to match the amplitude to phase modulation (AM-PM) characteristics of another system. For example, the PA 1220 may be used in a legacy electronic system that includes PAs based on an older technology (e.g., PAs using BJT devices), in which the PA 1220 has AM-PM characteristics that differ from the PAs based on the older technology. In this example, it may be desirable to match the AM-PM characteristics of the older devices.

To do this, the parameter circuit 1280 may include a LUT based on desired. AM-PM characteristics (AM-PM characteristics of an older device that the system is trying to match). In particular, the LUT may include entries for different input amplitudes, in which each input amplitude is mapped to a corresponding phase shift according to the desired AM-PM characteristics. In operation, the parameter circuit 1280 receives the measured input amplitude from the input envelope detector 1265, determines a desired phase shift from the measured input amplitude using the LUT, and outputs the desired phase shift to the phase control circuit 1250.

In another example application, it may be desirable for the system 1200 to maintain a desired group delay. To do this, the parameter circuit 1280 may include a LUT based on desired group delay. In particular, the LUT may include entries for different input frequencies, in which each input frequency is mapped to a corresponding phase shift according to the desired group delay. In operation, the parameter circuit 1280 receives the measured input frequency from the input frequency detector 1265, determines a desired phase shift from the measured input frequency using the LUT, and outputs the desired phase shift to the phase control circuit 1250.

In yet another example application, the system 1200 may use feedback control to maintain both desired AM-PM characteristics and group delay. In this example, the parameter circuit 1280 may include a LUT having two sets of entries: a set of different input frequencies and a set of different input amplitudes. The LUT may map each pair of input frequency and input amplitude to a corresponding phase shift in accordance with the desired AM-PM characteristics and group delay. In operation, the parameter circuit 1280 receives the measured input, frequency and input amplitude from the input frequency detector 1260 and input envelope detector 1265, respectively. The parameter circuit 1280 then determines a desired phase shift from the measured input frequency and measured input amplitude using the LUT, and outputs the desired phase shift to the phase control circuit 1250.

In general, the parameter circuit 1280 may determine the desired phase shift as a function of input amplitude, input frequency, temperature of any combination thereof. For the example where the parameter circuit 1280 determines the desired phase shift as a function of input amplitude, input frequency and temperature, the parameter circuit 1280 may include a LUT having three sets of entries: a set of different input frequencies, a set of different input amplitudes, and a set of different temperatures. The LUT may map each combination of input frequency, input amplitude and temperature to a corresponding phase shift. In operation, the parameter circuit 1280 receives the measured input frequency, input amplitude and temperature from the input frequency detector 1260, input envelope detector 1265, and the temperature monitor 1275, respectively. The parameter circuit 1280 then determines a desired phase shift from the measured input frequency, input amplitude and temperature using the LUT, and outputs the desired phase shift to the phase control circuit 1250.

The parameter circuit 1280 may also determine the desired output amplitude as a function of input amplitude, input frequency, temperature or any combination thereof. For example, it may be desirable for the system 1200 to have a constant gain. In this example, the parameter circuit 1280 may include a LUT based on a desired gain. In particular, the LUT may include entries for different input amplitudes, in which each input amplitude is mapped to a corresponding output amplitude according to the desired gain. In operation, the parameter circuit 1280 receives the measured input amplitude from the input envelope detector 1265, determines a desired output amplitude from the measured input amplitude using the LUT, and outputs the desired output amplitude to the amplitude control circuit 1255.

In another example, it may be desirable for the system 1200 to have a constant output power. In this example, the parameter circuit 1280 may generate a desired output amplitude based on the desired output power, where power is related to the square of the amplitude.

In yet another example, the parameter circuit 1280 may determine the desired output amplitude as a function of input amplitude, input frequency and temperature. In this example, the parameter circuit 1280 may include a LUT having three sets of entries: a set of different input frequencies, a set of different input amplitudes, and a set of different temperatures. The LUT may map each combination of input frequency, input amplitude and temperature to a corresponding output amplitude. In operation, the parameter circuit 1280 receives the measured input frequency, input amplitude and temperature from the input frequency detector 1260, input envelope detector 1265, and the temperature monitor 1275, respectively. The parameter circuit 1280 then determines a desired output amplitude from the measured input frequency, input amplitude and temperature using the LUT, and outputs the desired output amplitude to the amplitude control circuit 1255.

Digital control loops according to embodiments of the present disclosure may converge faster than analog linear feedback loops as the digital loops may be non-linear and, therefore, may initially jump to a value that is very close to the desired performance prior to settling to the final value. RF stages may be designed to optimize power and efficiency without having to attempt to match the legacy BJT non-linear behavior. Digital loops may be implemented with commercial off the shelf (COTS) field programmable gate arrays (FPGA). Use of the feedback loops may facilitates easily replacing RF devices with other devices from different lots, different manufacturers, and even different technologies (e.g., possible substitution of gallium nitride (GaN) devices for currently implemented laterally diffused metal oxide semiconductors (LDMOS)).

Those of skill would further appreciate that the various illustrative logical blocks, circuits, circuits, and algorithm steps described in connection with the disclosure herein may be implemented as electronic hardware, computer software, or combinations of both. To clearly illustrate this interchangeability of hardware and software, various illustrative components, blocks, circuits, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, circuits, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software circuit executed by a processor, or in a combination of the two. A software circuit may reside in RAM memory, flash memory. ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer-readable storage media and communication media including media that facilitates transfer of a computer program from one place to another. A computer-readable storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), then the coaxial cable, fiber optic cable, twisted pair, or DSL, are included in the definition of computer-readable medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A system with digital non-linear loop control, comprising:
   a parameter control circuit configured to modify a signal based on a control signal;
   a processing circuit configured to process the signal;
   a parameter measurement circuit configured to measure a parameter value of the signal;
   a frequency measurement circuit configured to measure a frequency of the signal;
   a parameter circuit configured to determine a desired parameter value based on the measured frequency; and
   a digital non-linear control circuit configured to compare the measured parameter value with the desired parameter value, to determine a control signal value based on the comparison using a lookup table (LUT) that characterizes a non-linear control response of the system, and to output the control signal to the parameter control circuit based on the determined control signal value.

2. The system of claim 1, wherein the digital non-linear control circuit is configured to wait for a time delay between updates of the control signal, and the time delay is based on a time delay of the signal through the parameter control circuit and the processing circuit.

3. The system of claim 1, wherein the LUT characterizes a non-linear control response of the parameter control circuit.

4. The system of claim 1, wherein the LUT characterizes a non-linear control response of the parameter control circuit and the processing system.

5. The system of claim 1, wherein the parameter control circuit comprises a variable phase shifter.

6. The system of claim 5, wherein the LUT characterizes a non-linear control response of the phase shifter.

7. The system of claim 1, wherein the processing system comprises a power amplifier.

8. The system of claim 1, wherein the frequency of the signal is measured at an input of the system.

9. The system of claim 1, wherein the desired parameter value is a desired phase shift, and the parameter circuit is configured to determine the desired phase shift based on the measured frequency and a desired group delay.

10. A system with digital non-linear loop control, comprising:
    a parameter control circuit configured to modify a signal based on a control signal;
    a processing circuit configured to process the signal;
    a parameter measurement circuit configured to measure a parameter value of the signal;
    an amplitude measurement circuit configured to measure an amplitude of the signal;
    a parameter circuit configured to determine a desired parameter value based on the measured amplitude; and
    a digital non-linear control circuit configured to compare the measured parameter value with the desired parameter value, to determine a control signal value based on the comparison using a lookup table (LUT) that characterizes a non-linear control response of the system, and to output the control signal to the parameter control circuit based on the determined control signal value.

11. The system of claim 10, wherein the parameter control circuit comprises a variable attenuator.

12. The system of claim 10, wherein the amplitude of the signal is measured at an input of the system.

13. The system of claim 10, wherein the desired parameter value is a desired phase shift, and the parameter circuit is configured to determine the desired phase shift based on the measured amplitude and a desired amplitude modulation to phase modulation (AM-PM) characteristic.

14. A system with digital non-linear loop control, comprising:
a parameter control circuit configured to modify a signal based on a control signal;
a processing circuit configured to process the signal;
a parameter measurement circuit configured to measure a parameter value of the signal;
a temperature measurement circuit configured to measure a temperature of the system;
a parameter circuit configured to determine a desired parameter value based on the measured temperature; and
a digital non-linear control circuit configured to compare the measured parameter value with the desired parameter value, to determine a control signal value based on the comparison using a lookup table (LUT) that characterizes a non-linear control response of the system, and to output the control signal to the parameter control circuit based on the determined control signal value.

15. A method for digital non-linear loop control, comprising:
measuring a parameter value of a signal in a system;
measuring a frequency of the signal in the system;
determining a desired parameter value based on the measured frequency;
determining a difference between the measured parameter value and the desired parameter value;
determining a value for a control signal based on the difference using a lookup table (LUT) that characterizes a non-linear control response of the system; and
outputting the control signal to a parameter control circuit in the system based on the determined value for the control signal, wherein the parameter control circuit modifies the signal based on the control signal.

16. The method of claim 15, wherein the desired parameter value is a desired phase shift.

17. A method for digital non-linear loop control, comprising:
measuring a parameter value of a signal in a system;
measuring an amplitude of the signal in the system;
determining a desired parameter value based on the measured amplitude;
determining a difference between the measured parameter value and the desired parameter value;
determining a value for a control signal based on the difference using a lookup table (LUT) that characterizes a non-linear control response of the system; and
outputting the control signal to a parameter control circuit in the system based on the determined value for the control signal, wherein the parameter control circuit modifies the signal based on the control signal.

18. The method of claim 17, wherein the desired parameter value is a desired phase shift.

19. A system with digital non-linear loop control, comprising:
a parameter control circuit configured to shift a phase of a signal based on a control signal;
a processing circuit configured to process the signal;
a phase detection circuit configured to measure a phase shift of the signal through the system;
a frequency measurement circuit configured to measure a frequency of the signal;
a parameter circuit configured to determine a desired phase shift based on the measured frequency and a desired group delay; and
a digital non-linear control circuit configured to compare the measured phase shift with the desired phase shift, to determine a control signal value based on the comparison, and to output the control signal to the parameter control circuit based on the determined control signal value.

20. A system with digital non-linear loop control, comprising:
a parameter control circuit configured to shift a phase of a signal based on a control signal;
a processing circuit configured to process the signal;
a phase detection circuit configured to measure a phase shift of the signal through the system;
an amplitude measurement circuit configured to measure an amplitude of the signal;
a parameter circuit configured to determine a desired phase shift based on the measured amplitude and a desired amplitude modulation to phase modulation (AM-PM) characteristic; and
digital non-linear control circuit configured to compare the measured phase shift with the desired phase shift, to determine a control signal value based on the comparison, and to output the control signal to the parameter control circuit based on the determined control signal value.

* * * * *